(12) United States Patent
Furuyama et al.

(10) Patent No.: US 7,808,808 B2
(45) Date of Patent: Oct. 5, 2010

(54) NONVOLATILE MEMORY DEVICE HAVING A PLURALITY OF MEMORY BLOCKS

(75) Inventors: Takaaki Furuyama, Kani (JP); Makoto Niimi, Nagoya (JP); Masahiro Niimi, Okazaki (JP)

(73) Assignee: Spansion LLC, Sunnyvale, CA (US)

( * ) Notice: Subject to any disclaimer, the term of this patent is extended or adjusted under 35 U.S.C. 154(b) by 148 days.

(21) Appl. No.: 12/177,039

(22) Filed: Jul. 21, 2008

(65) Prior Publication Data

US 2009/0034334 A1 Feb. 5, 2009

(30) Foreign Application Priority Data

Jul. 26, 2007 (JP) .............................. 2007-194277

(51) Int. Cl.
*G11C 16/04* (2006.01)
(52) U.S. Cl. ......................................... 365/63; 365/226
(58) Field of Classification Search .................. 365/63, 365/226, 185.11, 185.18
See application file for complete search history.

(56) References Cited

U.S. PATENT DOCUMENTS

| 6,515,908 | B2* | 2/2003 | Miyawaki et al. | 365/185.22 |
| 2003/0218217 | A1* | 11/2003 | Saito | 257/390 |
| 2004/0062115 | A1* | 4/2004 | Takeuchi et al. | 365/202 |

* cited by examiner

*Primary Examiner*—Vu A Le

(57) ABSTRACT

A nonvolatile memory device 1 capable of preventing interference between a read operation and a rewrite operation, and capable of preventing malfunctions that may occur in the event the read operation and the rewrite operation are performed simultaneously between memory blocks is provided. The nonvolatile memory device 1 is provided with a plurality of banks, a rewrite control unit 2 to which a first power source line VCC1 and a first ground line VSS1 are connected and which is adapted to control a rewrite operation with respect to a bank i, and a read control unit 5 to which a second power source line VCC2 and a second ground line VSS2 are connected and which is adapted to control a read operation with respect to a bank j, wherein the rewrite control unit 2 and the read control unit 5 are arranged so as to be spaced from each another.

18 Claims, 7 Drawing Sheets

NONVOLATILE MEMORY DEVICE HAVING A PLURALITY OF MEMORY BLOCKS

CROSS-REFERENCE TO RELATED APPLICATIONS

The present invention is based on Japanese Patent Application No. 2007-194277 filed on Jul. 26, 2007, the disclosure of which is hereby incorporated by reference.

TECHNICAL FIELD

The invention relates to nonvolatile memory devices having a plurality of memory blocks and, more particularly, relates to a nonvolatile memory device in which read access operations and rewrite access operations with applied voltages differing from each other are carried out asynchronously with respect to each of a plurality of memory blocks.

BACKGROUND OF THE INVENTION

In a nonvolatile semiconductor memory device disclosed in Japanese Patent Application Publication No. 2001-344986, an external read Y gate YGE and an internal operation Y gate YGI are arranged opposite to each other at opposite sides in the column direction of a memory cell array MA in each bank. The external read Y gate YGE couples a selected column of the memory cell array MA with the external read sense amplifier 150 through an internal data transmission line 400, according to a column select signal supplied from an external read column decoder EXCD. The internal operation Y gate YGI couples a selected column of the memory cell array MA to a write circuit and an internal verify sense amplifier 250 through an internal data transmission line 420, in accordance with a column select signal supplied from an internal operation column decoder INCD. This configuration helps increase the degree of freedom in arranging the write circuit, internal verify sense amplifier 250 and external read sense amplifier 150.

Other related technologies of such nonvolatile memory device are disclosed in Japanese Patent Application Publication Hei. 10-242433 and Japanese Patent Application Publication No. 2001-67868.

However, in the above-described related art, a function in which, when an internal operation such as erase/write is carried out with respect to one memory block, access is made to the other memory blocks to read data therefrom is realized while commonly providing a write circuit and a sense amplifier with respect to a predetermined number of banks and simplifying the layout of the column selection circuit, thereby reducing chip area.

In addition, the related art does not describe the power source lines for supplying a power source voltage or/and ground lines in a circuit for carrying out a rewrite operation of erasing/writing, as an internal operation, and a circuit for carrying out an operation to read out data to the exterior, and does not disclose the related configurations of the power source lines or/and ground lines.

In a nonvolatile memory device having a plurality of memory blocks, the read operation and rewrite operation are carried out asynchronously between the memory blocks. For this reason, there may be cases that the read operation and the rewrite operation are carried out simultaneously. If the read operation in which a micro-signal must be amplified by a sense amplifier and the rewrite operation in which a boost voltage or/and negative voltage must be generated and a rewrite high-voltage stress is applied to a memory cell are carried out simultaneously, a problem arises that voltage fluctuations caused by the rewrite operation may become a noise source with respect to the read operation. For instance, charging/discharging of a nonvolatile-specific boost voltage or/and negative voltage of 9V/-9V produces an extremely large power source noise with respect to the sensitivity, at an initial phase of the operation, of a 1.8V external power source and a sense amplifier to be used at the time of the read operation.

Further, the above-described related art does not disclose the positional relationship between the circuit for carrying out the rewrite operation and the circuit for carrying out the read operation. If the write circuit 250 and the sense amplifier 150 are arranged close to each other, as shown in FIG. 7, to thus reduce chip area, a problem arises that malfunctions of the read system circuit may occur due to voltage fluctuations in the write system circuit which become a noise source.

SUMMARY OF THE INVENTION

The present invention has been made in view of the above-mentioned background art, and an object thereof is to provide a nonvolatile memory device in which the circuit for carrying out the read operation and the circuit for carrying out the rewrite operation are arranged so as to be spaced from each other on the chip layout, and the power source lines or/and the ground lines to both circuits are provided separately from each other, thereby preventing the occurrence of interferences between the read operation and the rewrite operation, which in turn helps prevent the occurrence of circuit malfunctions.

The nonvolatile memory device according to the present invention which was worked out to achieve the above-mentioned object is provided with a plurality of memory blocks, and is characterized in that it comprises: a rewrite control unit to which a first power source line or/and a first ground line are connected and which is adapted to control a rewrite operation with respect to the memory blocks; and a read control unit to which a second power source line or/and a second ground line are connected and which is adapted to control a read operation with respect to the memory blocks; wherein the rewrite control unit and the read control unit are arranged so as to be spaced from one another.

According to the present invention, in the nonvolatile memory device provided with a plurality of memory blocks, the rewrite control unit and the read control unit are arranged so as to be spaced from each other. The rewrite control unit is connected to the first power source line or/and the first ground line, thereby controlling the rewrite operation with respect to the memory blocks. The read control unit is connected to the second power source line or/and the second ground line, thereby controlling the read operation with respect to the memory blocks.

With such configuration, the rewrite control unit that controls a rewrite operation in which a charging/discharging operation is carried out to generate a boost voltage or/and a negative voltage, and a read control unit that controls a read operation in which a micro-signal must be amplified are arranged so as to be spaced from each another. Moreover, the rewrite control unit is connected to the first power source line or/and the first ground line, and the read control unit is connected to the second power source line or/and the second ground line, so that the rewrite control unit and the read control unit are each supplied with a power supply voltage or/and a ground voltage that differ from each another. This makes it possible to prevent voltage fluctuations associated with charging/discharging of a boost voltage and a negative voltage carried out under the control of the rewrite control unit from influencing the read control unit. Thus, the read operation can be reliably carried out even in the event the rewrite operation and the read operation are carried out simultaneously between the memory blocks.

Also, according to the present invention, the nonvolatile memory device provided with a plurality of memory blocks is characterized in that it comprises: a first voltage generating unit to which a first power source line or/and a first ground line are connected and which is adapted to generate a bias voltage required at the time of a rewrite operation; a sense amplifier to which the second power source line or/and the second ground line is connected and which is adapted to sense memory cell data at the time of a read operation; a rewrite memory block to which a bias voltage is applied from the first power generating unit; and a read memory block to which the sense amplifier is connected.

According to the present invention, the nonvolatile memory device is provided with a first voltage generating unit to which the first power source line or/and the first ground line is connected, and a rewrite memory block that is supplied with a bias voltage generated by the first voltage generating unit. Also, the nonvolatile memory device is provided with a sense amplifier to which the second power source line or/and the second ground line is connected, and a read memory block to which the sense amplifier is connected.

In the nonvolatile memory device according to the present invention, the power sources of the first voltage generating unit and the rewrite memory block, and the sense amplifier and the read memory block are each supplied with power supply voltages or/and ground voltages that differ from each another. This makes it possible to prevent voltage fluctuations associated with charging/discharging of a boost voltage or/and negative voltage carried out under the control of the first voltage generating unit and the rewrite block from influencing the sense amplifier and the read memory block. Thus, the read operation can be reliably carried out even in the event the rewrite operation and the read operation are carried out simultaneously between the memory blocks.

According to the present invention, a nonvolatile memory device can be provided in which interferences between the read operation and the rewrite operation can be prevented by arranging the circuit for carrying out the read operation and the circuit for carrying out the rewrite operation so as to be spaced from each other on the chip layout, and providing the power source lines or/and the ground lines to both circuits separately from each other, and malfunctions occurring in the case the read operation and the rewrite operation are carried out simultaneously between the memory blocks can be prevented.

DETAILED DESCRIPTION

Figure 1:
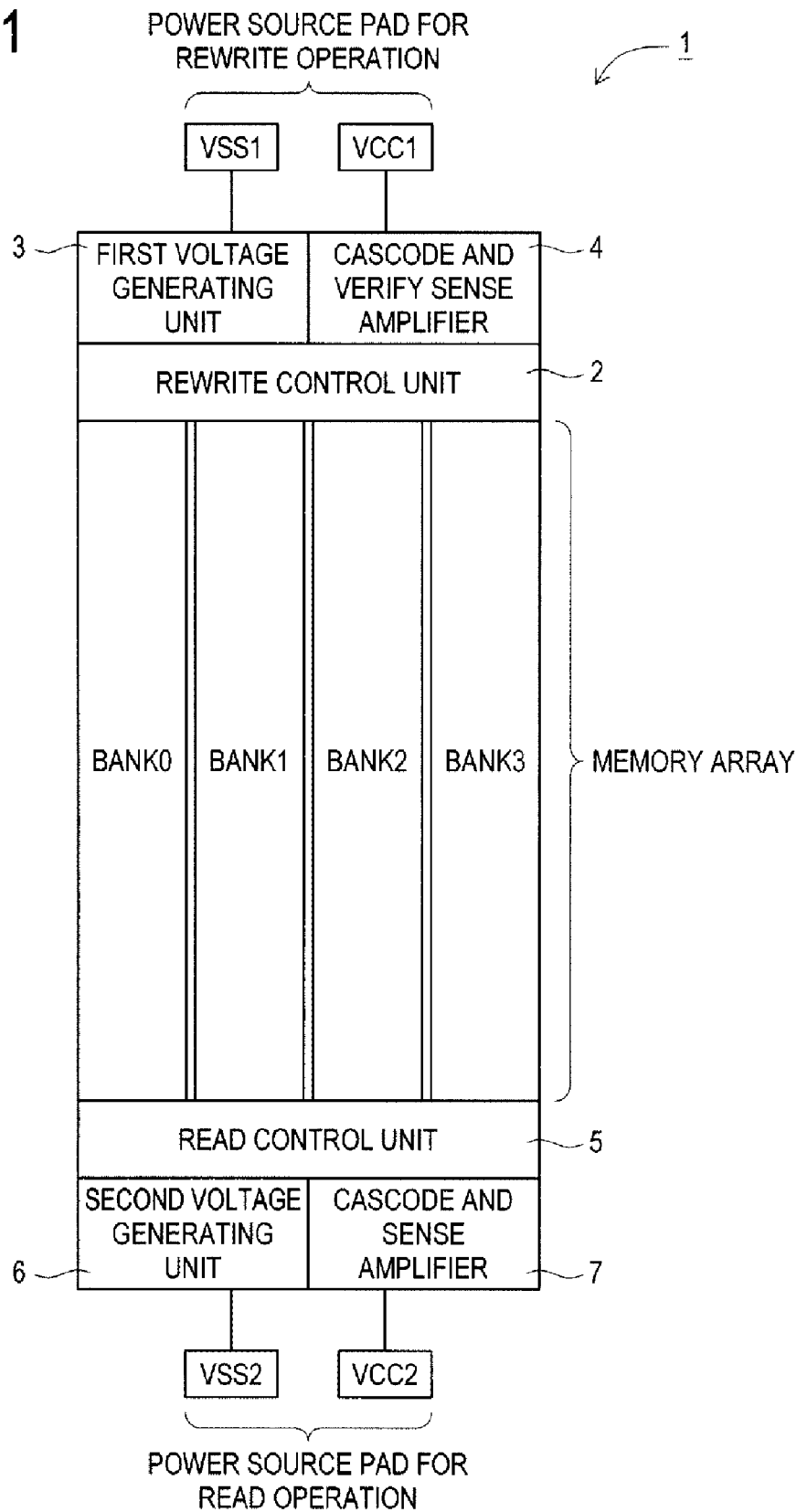
FIG. 1 is a circuit diagram showing the layout of a nonvolatile memory device according to an embodiment.

Referring to FIG. 1, a configuration diagram showing the layout of a nonvolatile memory device 1 according to the embodiment is depicted. The non-volatile memory device 1 comprises banks 0 through 3 in a memory array, and is capable of reading from a bank other than a predetermined bank while rewriting to the predetermined bank, in other words, it is capable of accommodating Simultaneous Operation (SO).

The nonvolatile memory device 1 comprises a rewrite control unit 2 arranged at an upper side of the memory array, and a read control unit 5 arranged at a lower side of the memory array.

Further, a first voltage generating unit 3 and a cascode amplifier and a verify sense amplifier 4 are arranged above the rewrite control unit 2. The power source lines and the ground lines of the rewrite control unit 2, and the first voltage generating unit 3, as well as the cascode amplifier and the verify sense amplifier 4 are connected to the first power source line VCC1 and the first ground line VSS1 extending from a power source pad for the rewrite operation.

Further, a second voltage generating unit 6 and a cascode amplifier and a sense amplifier 7 are arranged below the read control unit 5. The power source lines and the ground lines of the read control unit 5, and the second voltage generating unit 6, as well as the cascode amplifier and the sense amplifier 7 are connected to the second power source line VCC2 and the second ground line VSS2 extending from a power source pad for the read operation.

In the nonvolatile memory device 1 according to the present embodiment, the rewrite control unit 2 and the read control unit 5 are arranged so as to be spaced from each other. The rewrite control unit 2 is connected to the first power source line VCC1 and the first ground line VSS1, thereby controlling the rewrite operation with respect to the memory array. The read control unit 5 is connected to the second power source line VCC2 and the second ground line VSS2, thereby controlling the read operation with respect to the memory array.

With this configuration, the rewrite control unit 2 that controls the rewrite operation in which charging/discharging operations are performed for generating a boost voltage and a negative voltage, and the read control unit 5 that controls the read operation in which a micro-signal must be amplified are arranged so as to be spaced from each other. Further, the rewrite control unit 2 is connected to the first power source line VCC1 and the first ground line VSS1, so that a power supply voltage and a ground voltage which differ from each other are supplied to the read control unit 5. This makes it possible to prevent voltage fluctuations associated with charging/discharging of boost voltage and negative voltage carried out under the control of the rewrite control unit 2, from influencing the read control unit 5. Thus, the read operation can be reliably carried out even in the event the rewrite operation and the read operation are carried out simultaneously between the memory arrays.

The nonvolatile memory device 1 according to the present embodiment is also provided with a first voltage generating unit 3 that generates a bias voltage required at the time of the rewrite operation. The first voltage generating unit 3 is arranged close to the rewrite control unit 2. The device is further provided with a second voltage generating unit 6 that generates a bias voltage required at the time of the read operation. The second voltage generating unit 6 is arranged close to the read control unit 5.

This configuration helps reduce routing of the wiring between the first voltage generating unit 3 and the rewrite control unit 2, and routing of the wiring between the second voltage generating unit 6 and the read control unit 5. With this, it is possible to prevent voltage fluctuations associated with the charging/discharging of boost voltages and negative voltages carried out under the control of the rewrite control unit 2, which are caused by capacitive coupling between the wiring between the first voltage generating unit 3 and the rewrite control unit 2, and the wiring between the second voltage generating unit 6 and the read control unit 5, from influencing the read control unit 5.

In the nonvolatile memory device 1 according to the present embodiment, the first voltage generating unit 3 is connected to the first power source line VCC1 and the first ground line VSS1, and the second voltage generating unit 6 is connected to the second power source line VCC2 and the second ground line VSS2.

With this configuration, the first voltage generating unit 3 and the second voltage generating unit 6 are supplied with power supply voltages and ground voltages that respectively differ from each other. This makes it possible to prevent voltage fluctuations associated with charging/discharging of boost voltages and negative voltages carried out under the control of the first voltage generating unit 3 from influencing the second voltage generating unit 6.

Also, in the nonvolatile memory device 1 according to the present embodiment, the first power source line VCC1 and the second power source line VCC2, as well as the first ground line VSS1 and the second ground line VSS2 are each connected to their respective specific power source pads.

With such configuration, the respective power source lines and ground lines for the first voltage generating unit 3 and rewrite control unit 2, as well as the second voltage generating unit 6 and the read control unit 5 are completely separated on the semiconductor device. This makes it possible to prevent the voltage fluctuations associated with charging/discharging of boost voltages and negative voltages carried out in the first voltage generating unit 3, under the control of the rewrite control unit 2, from influencing the second voltage generating unit 6.

In the nonvolatile memory device 1 according to the present embodiment, the rewrite control unit 2 and the read control unit 5 are arranged to face each other across the memory array. The impedances between the rewrite control unit 2 and the read control unit 5 are related depending on the substrate resistance which is proportional to the size (length) of the memory array.

Thus, the noise generated in the rewrite control unit 2 and the first voltage generating unit 3, etc. to which the first power source lines VCC1 and the first ground line VSS1 are connected can be weakened depending on the substrate resistance which is proportional to the length of the memory array. This allows the read operation of the read control unit 5 and the cascode amplifier and sense amplifier 7 to be reliably carried out.

In the nonvolatile memory device 1 according to the present embodiment, the four terminals (gate, drain, source and back gate) of the memory cell inside the bank subjected to the write operation, and the respective voltages to be applied to these terminals are all connected to the first power source line VCC1, the first ground line VSS1 and the write internal power source line of the first voltage generating unit generated therefrom. Similarly, the four terminals of the memory cell inside the bank subjected to the read operation and the respective voltages to be applied to these terminals are all connected to the second power source line VCC2, the second ground line VSS2 and the read internal power source line of the second voltage generating unit 6 generated therefrom.

With this configuration, noise caused by charging/discharging of the four terminals of the memory cell inside the bank subjected to the write operation with a large parasitic capacitance does not interfere with the four terminals of the memory cell inside the bank subjected to the read operation, thereby allowing the read operation to be reliably carried out.

Figure 2:
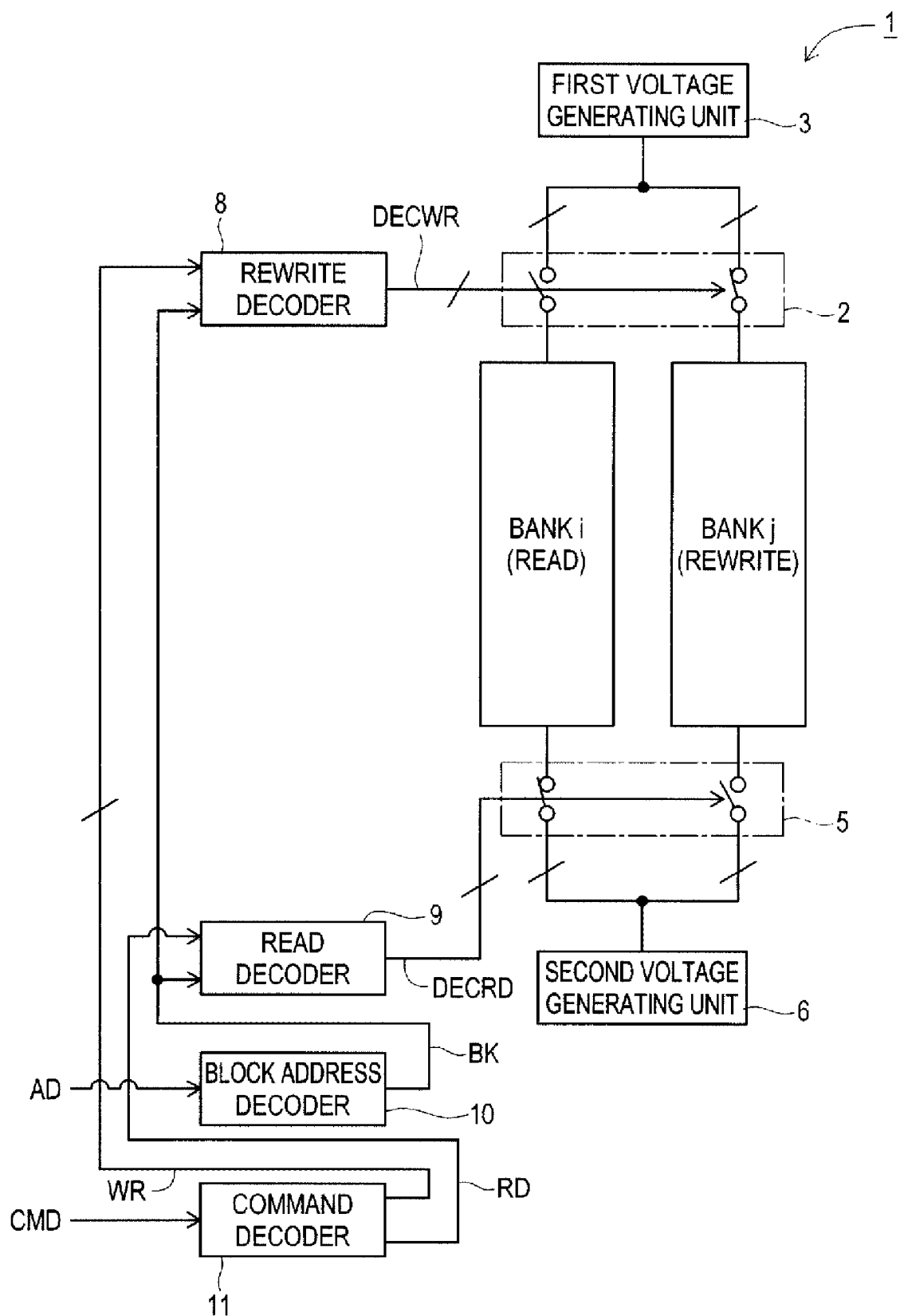
FIG. 2 is a block diagram showing a circuit configuration of the nonvolatile memory device according to the embodiment.

Next, a circuit configuration of the nonvolatile memory device 1 according to the present embodiment will be described. FIG. 2 is a block diagram showing the circuit configuration of the nonvolatile memory device 1 according to the present embodiment.

The nonvolatile memory device 1 comprises a rewrite decoder 8, a read decoder 9, a block address decoder 10 and a command decoder 11, in addition to the rewrite control unit 2, first voltage generating unit 3, read control unit 5, second voltage generating unit 6 and the memory array previously described.

The rewrite control unit 2 is provided with a first switching unit that controls the supply of bias voltage generated by the first voltage generating unit 3, to the memory array. Also, the read control unit 5 is provided with a second switching unit that controls the supply of bias voltage generated by the second voltage generating unit 6, to the memory array.

The rewrite decoder 8 is connected to the first power source line VCC1 (1.8V) and the first ground line VSS1 (0V), and the read decoder 9 is connected to the second power source line VCC2 (1.8V) and the second ground line VSS2 (0V). The block address decoder 10 and the command decoder 11 are preferably connected to the second power source line VCC2 and the second ground line VSS2. The reason for this is, as will be described later, that the noise at the second power source line VCC2 and the second ground line VSS2 is less than at the first power source line VCC1 and the first ground line VSS1 that charge/discharge high voltages.

Also, the rewrite decoder 8 and the read decoder 9 are arranged to face each other, with the memory array provided therebetween, similarly with the arrangement of the rewrite control unit 2 and the read control unit 5 as shown in FIG. 1.

If the noise resistance at the rewrite decoder 8 is low, the rewrite decoder 8 may be connected to the second power source line VCC2 and the second ground line VSS2, and may be arranged at the read control unit 5 side. A write decode signal DECWR which is the output signal of the rewrite decoder 8 is preferably input to the first switching unit, by a level shift circuit (not illustrated) connected to the first power source line VCC1 and the first ground line VSS1.

The block address decoder 10 receives an address AD and outputs a memory bank address BK suitable for the bank of the memory array.

The command decoder 11 receives a command signal CMD, and activates a write signal WR when the command signal CMD carries a rewrite instruction, an erase instruction or a verify instruction, and activates a read signal RD when the command signal CMD carries a read instruction.

The rewrite decoder 8 receives a memory bank address BK and a write signal WR, and if the write signal WR is in an active state, outputs a write decode signal DECWR which places the switch of the first switching unit of a corresponding bank (in this example, bank j) in a conductive state, in response to the command signal CMD. In this manner, the switch, from the switches of the first switching unit provided in the rewrite control unit 2, which is connected to bank j becomes conductive, so that a bias voltage is supplied from the first voltage generating unit 3 to the bank j.

The read decoder 9 receives a memory bank address BK and a read signal RD, and if the read signal RD is in an active state, outputs a read decode signal DECRD which places the switch of the second switch unit for the corresponding bank (in this example, bank i), in a conductive state. In this manner, the switch, from the switches of the second switching unit provided in the rewrite control unit 5, which is connected to bank i becomes conductive, so that a bias voltage is supplied from the second voltage generating unit 6 to the bank i.

In the nonvolatile memory device 1 according to the present invention, the rewrite control unit 2 is provided with a first switching unit that controls the supply of bias voltage generated by the first voltage generating unit 3 to bank j for performing a memory rewrite. Also, the read control unit 5 is provided with a second switching unit that controls the supply of bias voltage generated by the second voltage generating unit 6 to the bank i for performing a memory read.

Also, the nonvolatile memory device 1 according to the present embodiment is also provided with the command decoder 11 and the block address decoder 10 that identifies memory arrays. The first switching unit and the second switching unit are selected based on the decoding results of the command decoder 11 and block address decoder 10.

Further, in the nonvolatile memory device 1 according to the present embodiment, the first switching unit is selected with respect to bank j, with respect to which a rewrite operation is requested, and the second switching unit is selected with respect to a bank (in this example, bank i) other than bank j with respect to which the rewrite operation was requested.

In this manner, it is possible to prevent voltage fluctuations associated with charging/discharging of boost voltages and negative voltages performed in order to carry out the rewrite operation to the memory corresponding to bank j from influencing the read operation from the memory corresponding to bank i. This allows the read operation to be carried out reliably even in the event the rewrite operation and the read operation are carried out simultaneously between banks.

Figure 3:
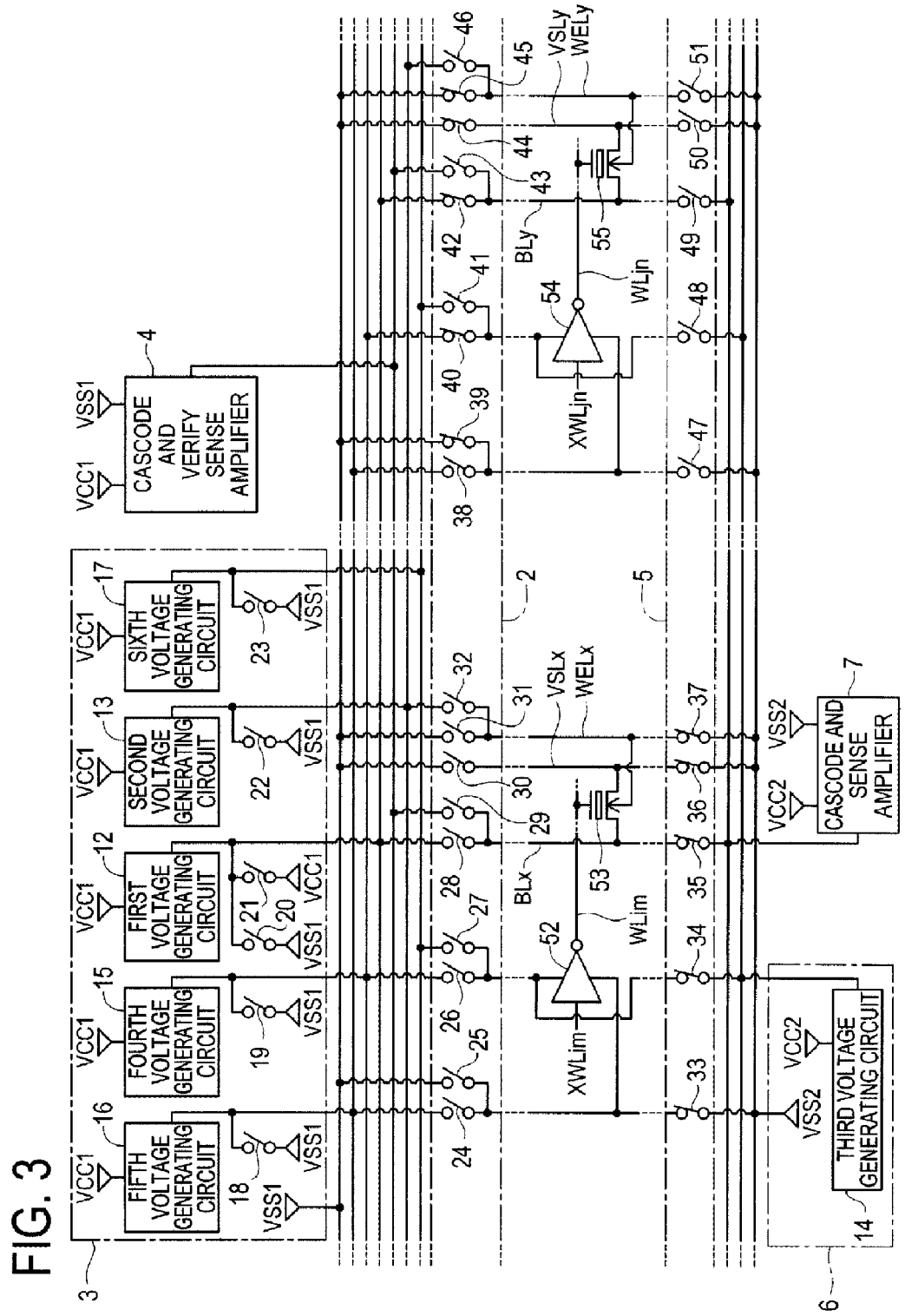
FIG. 3 is a circuit diagram showing the case that the read operation and the rewrite operation are carried out simultaneously.

Next, the case that the read operation and the rewrite operation are carried out simultaneously will be described in detail. FIG. 3 is a circuit diagram showing the case that the read operation and the rewrite operation are carried out simultaneously. Here, memory cell 53 is the memory cell with respect to which the read operation is carried out, and memory cell 55 is the memory cell with respect to which the rewrite operation is carried out.

A word line WLim connected to the output terminal of an inverter 52 is connected to the gate terminal of the memory cell 53. A decode signal XWLim output from an un-illustrated address decoder is connected to the input of the inverter 52. Switches 26 and 27 of the rewrite control unit 2 and switch 34 of the read control unit 5 are connected to the power source terminal of the inverter 52. Further, switches 24 and 25 of the rewrite control unit and switch 33 of the control unit 5 are connected to the ground terminal of the inverter 52.

A bit line BLx is connected to the drain terminal of the memory cell 53. Switches 28 and 29 of the rewrite control unit 2 and switch 35 of the read control unit 5 are connected to the bit line BLx.

A ground line VSLx is connected to the source terminal of the memory cell 53. A switch 30 of the rewrite control unit 2 and a switch 36 of the read control unit 5 are connected to the ground line VSLx.

A well line WELx is connected to the back gate terminal of the memory cell 53. Switches 31 and 32 of the rewrite control unit 2 and switch 37 of the read control unit 5 are connected to the well line WELx.

A word line WLjn connected to the output terminal of the inverter 54 is connected to the gate terminal of the memory cell 55. A decode signal XWLjn input from the un-illustrated address decoder is connected to the input of the inverter 54. Switches 40 and 41 of the rewrite control unit 2 and switch 48 of the read control unit 5 are connected to the power source terminal of the inverter 54. Further, switches 38 and 39 of the rewrite control unit 2 and switch 47 of the read control unit 5 are connected to the ground terminal of the inverter 54.

A bit line BLy is connected to the drain terminal of the memory cell 55. Switches 42 and 43 of the rewrite control unit 2 and switch 49 of the read control unit 5 are connected to the bit line BLy.

A ground line VSLy is connected to the source terminal of the memory cell 55. A switch 44 of the rewrite control unit 2 and switch 50 of the read control unit 5 are connected to the ground line VSLy.

A well line WELy is connected to the back gate terminal of the memory cell 55. Switches 45 and 46 of the rewrite control unit 2 and switch 51 of the read control unit 5 are connected to the well line WELy.

The first voltage generating unit 3 is provided with a first voltage generating circuit 12, a second voltage generating circuit 13, a fourth voltage generating circuit 15, a fifth voltage generating circuit 16, a sixth voltage generating circuit 17, switches 18 through 23, the first power source line VCC1 and the first ground line VSS1.

The first voltage generating circuit 12 serves to supply a rewrite bias voltage (in this example, 5V) to each bit line, at the time of the rewrite operation. In this example, this output voltage is connected to switches 28 and 42 of the rewrite control unit 2. Switch 21 connected to the output terminal of the first voltage generating circuit 12 serves to discharge the voltage supplied from the first voltage generating circuit 12 to the first power source line VCC1, following the rewrite operation. One end of the switch 21 is connected to the first power source line VCC1. After the rewrite operation has been completed, switch 21 is made conductive and the rewrite bias voltage (in this example, 5V) is discharged to the first power source line VCC1, with the switch connecting the output terminal of the first voltage generating circuit 12 to the bit line of the memory cell which was rewritten being placed in a conductive state. Further, switch 20 serves to discharge a potential lowered to the potential of the first power source line VCC1 to the first ground line VSS1, and is made conductive with the switch 21 being placed in a non-conductive state. The output voltage of the first voltage generating circuit 12 and the bit line are thus discharged to the first ground line VSS1.

The second voltage generating circuit 13 serves to supply an erase bias voltage (in this example, 9V) to a well, at the time of the erase operation with respect to the memory cell. In this example, this output voltage is connected to switches 32 and 46 of the rewrite control unit 2. Also, switch 22 connected to the output terminal of the second voltage generating circuit 13 serves to discharge the voltage supplied from the second voltage generating circuit 13 and the voltage of the well line WELy to the first ground line VSS1, following the erase operation. One end of the switch 22 is connected to the first ground line VSS1 and is made conductive after the erase operation is completed. The output voltage of the second voltage generating circuit 13 and the voltage of the well line WELy are thus discharged to the first ground line VSS1.

Here, an element similar to the above-described switch 21 connected at one end thereof to the first power source line VCC1 may be attached, and the erase bias voltage (in this example, 9V) may be discharged to the first power source line VCC1.

The fourth voltage generating circuit 15 serves to supply a rewrite bias voltage (in this example, 9V) to a word line through the inverter, at the time of a rewrite operation with respect to the memory cell. In this example, this output voltage is connected to switches 26 and 40 of the rewrite control unit 2. Switch 19 connected to the output terminal of the fourth voltage generating circuit 15 serves to discharge the voltage supplied from the fourth voltage generating circuit 15 and the voltage at the power source terminal of the inverter to VSS1, following the rewrite operation. One end of switch 19 is connected to the first ground line VSS1 and is made conductive after the rewrite operation. The output voltage of the fourth voltage generating circuit 15 and the voltage at the power source terminal of the inverter are discharged to the first ground line VSS1.

Here, an element similar to the above-described switch 21 connected at one end thereof to the first power source line VCC1 may be attached, and the rewrite bias voltage (in this example, 9V) may be discharged to the first power source line VCC1.

The fifth voltage generating circuit 16 serves to supply an erase bias negative voltage (in this example, -9V) to a word line through an inverter, at the time of carrying out the erase operation with respect to the memory cell. In this example, the output terminal of the circuit is connected to switches 24 and 38 of the rewrite control unit 2. Switch 18 connected to the output terminal of the fifth voltage generating circuit 16 serves to discharge the negative voltage supplied from the fifth voltage generating circuit 16 to VSS1, following the erase operation. One end of switch 18 is connected to the first ground line VSS1, and is made conductive after the erase operation. The output voltage of the fifth voltage generating circuit 16 is thus discharged to the first ground line VSS1.

The sixth voltage generating circuit 17 serves to supply a verify bias voltage (in this example, 4V) to a word line through the inverter, at the time a verify operation is carried out with respect to the memory cell. In this example, the output terminal of the circuit is connected to switches 27 and 41 of the rewrite control unit 2. Switch 23 connected to the output terminal of the sixth voltage generating circuit 17 serves to discharge the voltage supplied from the sixth voltage generating circuit 17 to the first ground line VSS1, following the verify operation. One end of the switch 23 is connected to the first ground line VSS1, and is made conductive after the verify operation. The output voltage of the sixth voltage generating circuit 17 is discharged to the first ground line VSS1.

Here, an element similar to the above-described switch 21 connected at one end thereof to the first power source line VCC1 may be attached, and the verify bias voltage (in this example, 4V) may be discharged to the first power source line VCC1.

The first ground line VSS1 is connected to switches 25 and 39 to supply a 0V voltage with respect to a non-selected word line, at the time a verify operation is carried out. The first ground line VSS1 is connected to switches 30, 31, 44 and 45 to supply a 0V voltage to a back gate terminal and a source terminal of a memory cell at the time the rewrite operation is carried out.

The cascode amplifier and the verify sense amplifier 4 serves to carry out a verify operation with respect to the memory cell by passing a current through the bit line to be subjected to the verify operation, to carry out a current-to-voltage conversion, and finally detecting the voltage value of the resulting voltage. In this example, the terminal of the cascode amplifier and verify sense amplifier 4 is connected to switches 29 and 43 of the rewrite control unit 2.

The second voltage generating unit 6 is provided with the third voltage generating circuit 14, second ground line VSS2 and second power source line VCC2.

The third voltage generating circuit 14 serves to supply a read bias voltage (in this example, 4V) through the inverter, with respect to a selected word line, at the time the read operation is carried out with respect to a memory cell. The output terminal of the circuit is connected to the switches 34 and 48 of the read control unit 5.

The second ground line VSS2 supplies a 0V voltage to the back gate terminal and source terminal of a memory cell other than those subjected to the rewrite operation. In this example, the second ground line VSS2 is connected to switches 36, 37, 50 and 51 of the read control unit 5.

The cascode amplifier and the sense amplifier 7 serves to carry out a read operation with respect to the memory cell by passing a current through the bit line to be subjected to the read operation to the exterior of the nonvolatile memory device, to carry out a current-to-voltage conversion, and finally detecting the voltage value of the resulting voltage. In this example, the terminal of the cascode amplifier and sense amplifier 7 is connected to switches 35 and 49 of the read control unit 5.

When a rewrite operation is carried out with respect to the memory cell 55, switches 38, 41, 43 and 46 of the rewrite control unit 2 are made non-conductive, whereas switches 39, 40, 42, 44 and 45 are made conductive. Switches 47 through 51 of the read control unit 5 are all made non-conductive. A 9V voltage is thus applied to the word line WLjn, and a 0V voltage is applied to the back gate terminal and source terminal of the memory cell 55, thereby allowing for the rewrite operation to the memory cell to be carried out.

After the rewrite operation has been performed, switch 21 of the first voltage generating unit 3 is made conductive so that the rewrite bias voltage (in this example, 5V) is discharged to the first power source line VCC1, with first voltage generating circuit 12 being in a deactivated state and the switch 42 of the rewrite control unit 2 being placed in a conductive state. Then, the switch 21 is made non-conductive, and the switch 20 is made conductive, so that the output voltage of the first voltage generating circuit 12 and the voltage charged to the bit line are discharged to the first ground line VSS1.

Alternatively, after the rewrite operation has been performed, switch 19 of the first voltage generating unit 3 is made conductive so that the output voltage of the fourth voltage generating circuit 15 and the voltage at the power source terminal of the inverter are discharged to the first ground line VSS1, with the fourth voltage generating circuit 15 being in a deactivated state and the switch 40 being placed in a conductive state.

Charging/discharging of these voltage generating circuits produces fluctuations of the voltage in the first ground line VSS1, which thus become a noise source. However, in the nonvolatile memory device 1 according to the present embodiment, the first ground line VSS1 and the first power source line VCC1 are separated from the second ground line VSS2 and the second power source line VCC2 which serve as power sources for performing the read operation. This makes it possible to prevent fluctuations of the voltage associated with charging/discharging of a boost voltage of the first voltage generating unit 3 carried out under the control of the rewrite control unit 2 from influencing the cascode amplifier and the sense amplifier 7. As a result, the read operation with respect to the memory cell 53 can be reliably carried out.

Figure 4:
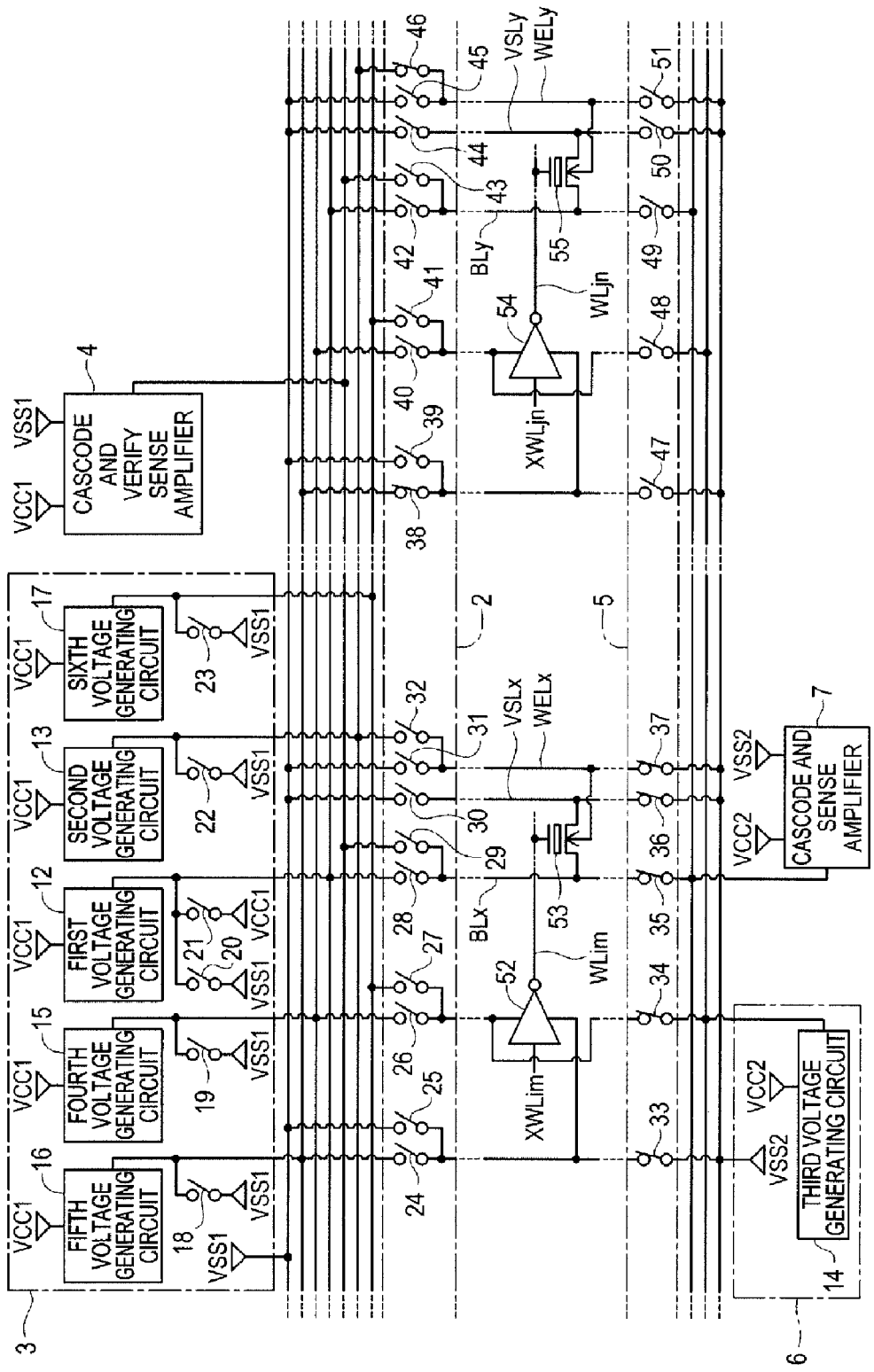
FIG. 4 is a circuit diagram showing the case that the read operation and the erase operation are carried out simultaneously.

Next, a detailed description will be given of the case in which the read operation and the erase operation are carried out simultaneously. FIG. 4 is a circuit diagram of the case that the read operation and the erase operation are carried out simultaneously. Here, memory cell 53 is a memory cell with respect to which a read operation is carried out, and memory cell 55 is a memory cell with respect to which an erase operation is carried out. This circuit has been described while referring to FIG. 3, and further description thereof is hereby omitted When the read operation is carried out with respect to the memory cell 53, switches 24 through 32 of the rewrite control unit 2 are all made non-conductive, and switches 33 through 37 of the read control unit 5 are all made conductive. As a result, a 4V voltage is applied to the word line WLim, and a 0V voltage is applied to the back gate terminal and source terminal of the memory cell 53. The cascode amplifier and sense amplifier 7 passes a current through the bit line BLx, so as to perform a current-to-voltage conversion, and detects the resulting voltage.

When the erase operation is carried out with respect to the memory cell 55, switches 39 through 45 of the rewrite control unit 2 are made non-conductive, and switches 38 and 46 are made conductive. Switches 47 through 51 of the read control unit 5 are made non-conductive. Thus, the selected word line has a −9V voltage, the back gate terminal of the memory cell 55 has a 9V voltage, and the drain terminal and source terminal of the memory cell 55 become floating. As a result, the erase operation is carried out with respect to the memory cell 55.

After the erase operation has been carried out, switches 18 and 22 of the first voltage generating unit 3 are made conductive, with switches 38 and 46 being in a conductive state. As a result, the output voltage of the fifth voltage generating circuit 16, the voltage at the ground terminal of the inverter and the output voltage of the second voltage generating circuit 13 and the well line WELy are discharged to the first ground line VSS1.

Charging/discharging of these voltage generating circuits produce voltage fluctuations in the first ground line VSS1, which can become a noise source. However, in the nonvolatile memory device 1 according to the present embodiment, the first ground line VSS1 and first power source line VCC1 are separated from the second ground line VSS2 and the second power source line VCC2 which serve as power sources for performing the read operation. This makes it possible to prevent voltage fluctuations associated with charging/discharging of boost voltages and negative voltages of the first voltage generating circuit 3 carried out under the control of the rewrite control unit 2 from influencing the cascode amplifier and the sense amplifier 7. As a result, the read operation with respect to the memory cell 53 can be reliably carried out.

Figure 5:
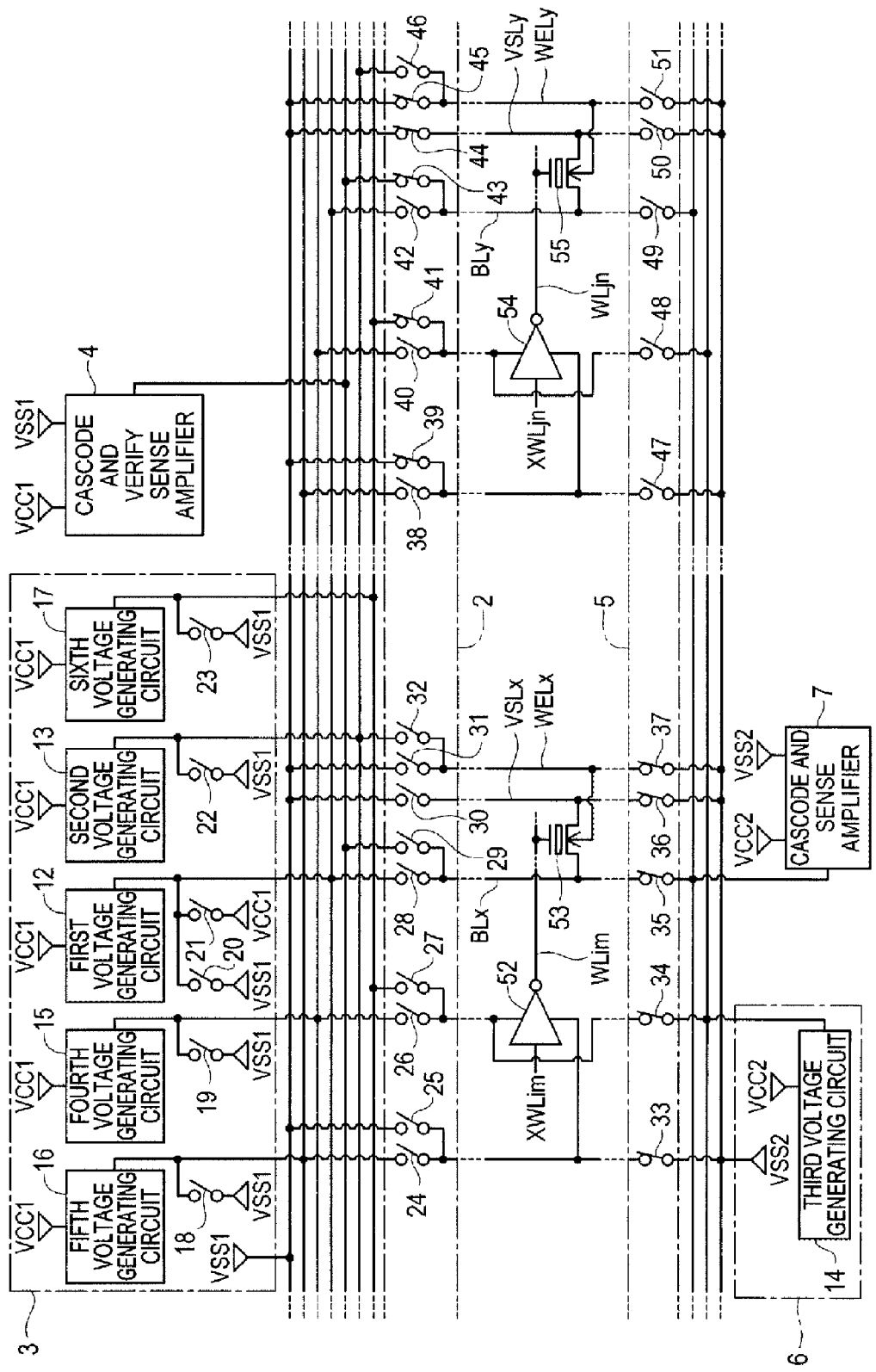
FIG. 5 is a circuit diagram showing the case that the read operation and the verify operation are carried out simultaneously.
Figure 6:
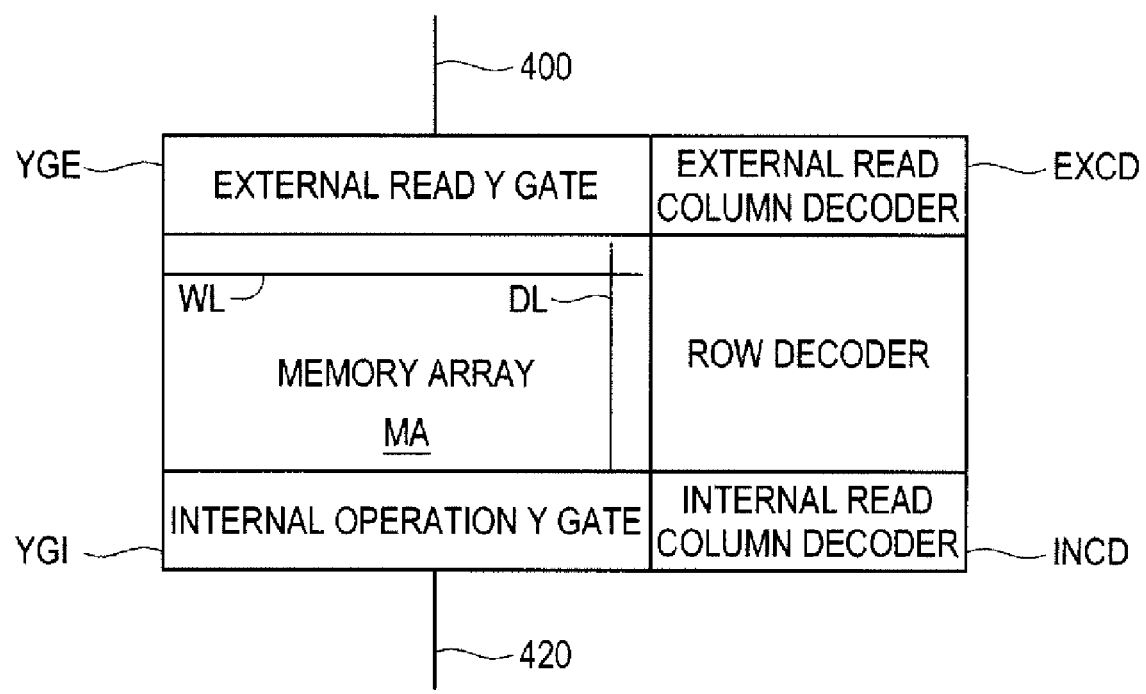
FIG. 6 is a configuration diagram showing the layout of a conventional nonvolatile memory device.
Figure 7:
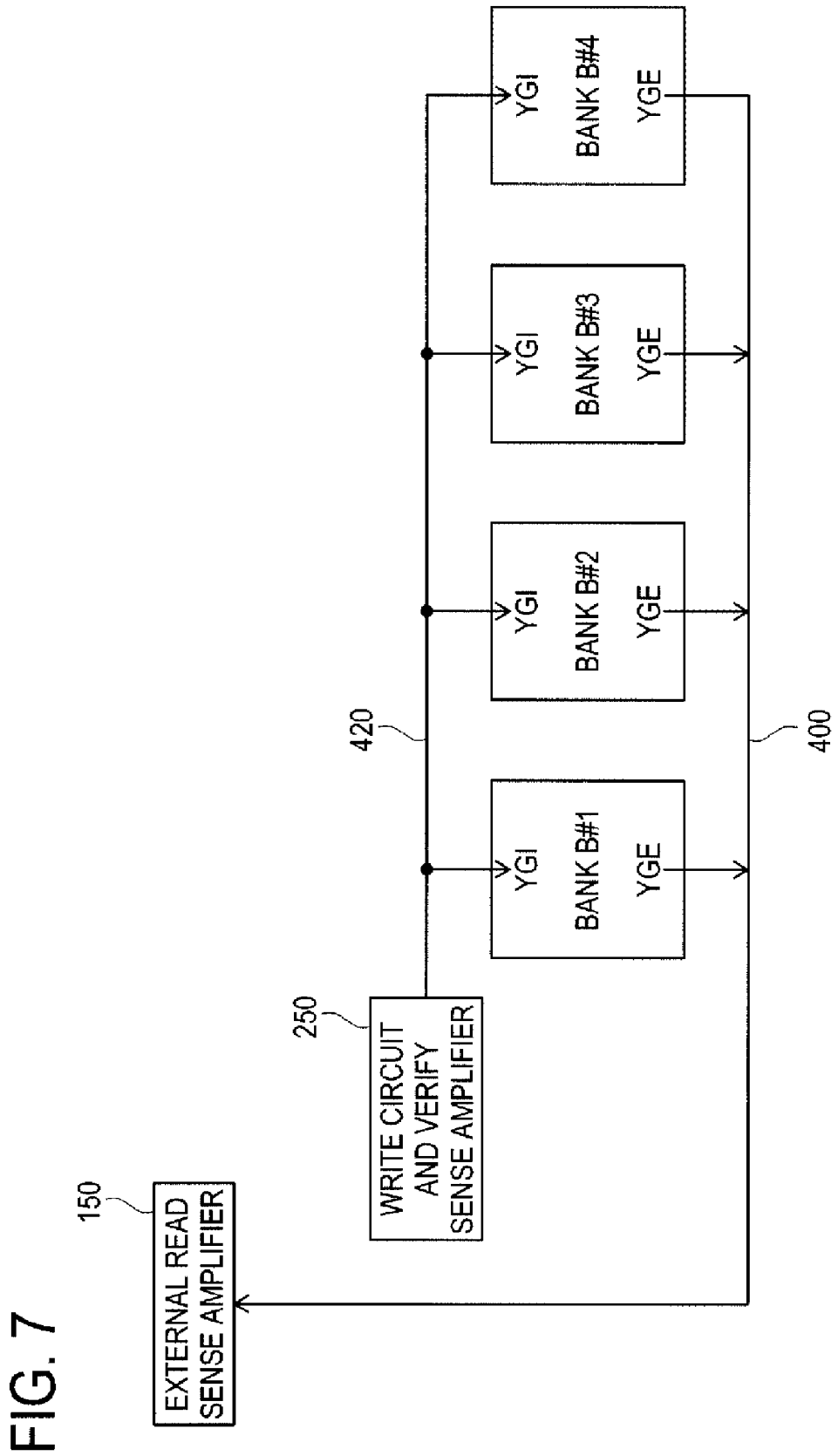
FIG. 7 is a block diagram showing the circuit configuration of the conventional nonvolatile memory device.

Next, the case in which the read operation and the verify operation are carried out simultaneously will be described in detail. FIG. 5 is a circuit diagram showing the case that the read operation and the verify operation are carried out simultaneously. Here, memory cell 53 is the memory cell with respect to which the read operation is carried out, and memory cell 55 is the memory cell with respect to which the verify operation is carried out. This circuit has been described while referring to FIG. 3, and further description thereof is hereby omitted.

When the read operation is carried out with respect to the memory cell 53, switches 24 through 32 of the rewrite control unit 2 are all made non-conductive, and switches 33 through 37 of the read control unit 5 are all made conductive. As a result, a 4V voltage is applied to the word line WLim, and a 0V voltage is applied to the back gate terminal and the source terminal of the memory cell 53. The cascode amplifier and the sense amplifier 7 passes a current through the bit line BLx so as to perform a current-to-voltage conversion, and detects the resulting voltage.

When the verify operation is carried out with respect to the memory cell 55, switches 38, 40, 42 and 46 of the rewrite control unit 2 are made nonconductive, and switches 39, 41, 43, 44 and 45 of the rewrite control unit 2 are made conductive. As a result, a 4V voltage is applied to the selected word line WLjn, and a 0V voltage is applied to the back gate terminal and source terminal of the memory cell 55. The cascode amplifier and verify sense amplifier 4 passes a current through the bit line BLy, so as to perform a current-to-voltage conversion and detects the resulting voltage.

After the verify operation has been carried out, switch 23 of the first voltage generating unit 3 is made conductive so as to allow the output voltage of the sixth voltage generating circuit 17 and the voltage at the power source terminal of the inverter to be discharged to the first ground line VSS1, with the sixth voltage generating circuit 17 in a deactivated state, and switch 41 in a conductive state.

Charging/discharging of these voltage generating circuits produces fluctuations of the voltage in the first ground line VSS1, which thus becomes a noise source. However, in the nonvolatile memory device 1 according to the present embodiment, the first ground line VSS1 and the first power source line VCC1 are separated from the second ground line VSS2 and the second power source line VCC2 which serve as power sources for carrying out the read operation. This makes it possible to prevent voltage fluctuations associated with charging/discharging of boost voltages in the first voltage generating unit 3 carried out under the control of the rewrite control unit 2 from influencing the cascode amplifier and sense amplifier 7. As a result, the read operation with respect to the memory cell 53 can be reliably carried out.

The present invention is not limited to the above-described embodiments, and various improvements and modifications thereof are applicable, without departing from the spirit and scope of the present invention.

For instance, although in the present invention an example was described in which one first voltage generating unit 3, one cascode amplifier and verify sense amplifier 4, one second voltage generating unit 6, one cascode amplifier and sense amplifier 7 are arranged with respect to all banks, the present invention can also be applied in the case that the above elements are arranged with respect to each bank.

The present invention can also be applied to a virtual ground-type memory array. The ground lines VSLx and VSLy are changed to bit lines BLx and BLy.

The present invention can also be applied to a NAND-type memory array. The program used in this case is FN-tunneling, which makes it possible to realize, in the memory cell, an inverse voltage relationship with the above-described erase operation, under the control of the switch provided in the rewrite control unit 2.

Further, the power source of the cascode amplifier and the verify sense amplifier 4 for the verify operation can be connected to the second power source line VCC2 and the second ground line VSS2.

Banks 0 through 3 are one example of memory blocks, switches 28, 29, 42 and 43 are one example of the first switching unit in claim 13, switches 35 and 49 are one example of the second switching unit in claim 13, switches 30 and 44 are one example of the third switching unit, switches 36 and 50 are one example of the fourth switching unit, switches 31, 32, 45 and 46 are one example of the fifth switching unit, switches 37 and 51 are one example of the sixth switching unit, switches 24 through 27 and 38 through 41 are one example of the seventh switching unit, and switches 33, 34, 47 and 48 are one example of the eighth switching unit.

What is claimed is:

1. A nonvolatile memory device provided with a plurality of memory blocks, the nonvolatile memory device comprising:
a rewrite control unit to which at least one of a first power source line and a first ground line are connected and which is operable to control a rewrite operation with respect to the memory blocks; and
a read control unit to which at least one of a second power source line and a second ground line are connected and which is operable to control a read operation with respect to the memory blocks, wherein the rewrite control unit and the read control unit are arranged so as to be spaced apart from one another.

2. The nonvolatile memory device in accordance with claim 1, further comprising:
a first voltage generating unit that generates a bias voltage required at the time of the rewrite operation; and
a second voltage generating unit that generates a bias voltage required at the time of the read operation, wherein the first voltage generating unit is arranged close to the rewrite control unit, and wherein the second voltage generating unit is arranged close to the read control unit.

3. The nonvolatile memory device in accordance with claim 2, wherein at least one of the first power source line and the first ground line are connected to the first voltage generating unit, and wherein at least one of the second power source line and the second ground line are connected to the second voltage generating unit.

4. The nonvolatile memory device in accordance with claim 2, wherein the rewrite control unit is provided with a first switching unit that controls supply of a bias voltage generated by the first voltage generating unit to the memory blocks, and wherein the read control unit is provided with a second switching unit that controls supply of a bias voltage generated by the second voltage generating unit to the memory blocks.

5. The nonvolatile memory device in accordance with claim 4, further comprising:
a command decoder; and
a block address decoder that identifies the memory blocks, wherein the first switching unit and the second switching unit are selected depending on decoding results of the command decoder and the block address decoder.

6. The nonvolatile memory device in accordance with claim 5, wherein the first switching unit is selected with respect to the memory blocks to which the rewrite operation is requested, and wherein the second switching unit is selected with respect to a memory block other than the memory blocks to which the rewrite operation was requested.

7. The nonvolatile memory device in accordance with claim 3, wherein the rewrite control unit is provided with a first switching unit that controls supply of a bias voltage generated by a first voltage generating unit to the memory blocks, and wherein the read control unit is provided with a second switching unit that controls supply of a bias voltage generated by the second voltage generating unit to the memory blocks.

8. The nonvolatile memory device in accordance with claim 4, wherein the first switching unit is selected with respect to the memory blocks to which the rewrite operation is requested, and wherein the second switching unit is selected with respect to a memory block other than the memory blocks to which the rewrite operation was requested.

9. The nonvolatile memory device in accordance with claim 1, wherein the rewrite control unit and the read control unit are arranged so as to face each other, with a memory cell block provided therebetween.

10. The nonvolatile memory device in accordance with claim 1, wherein at least one of the first power source line and the first ground line and at least one of the second power source line and the second ground line are each connected to their dedicated terminals.

11. A nonvolatile memory device provided with a plurality of memory blocks, the nonvolatile memory device comprising:
a first voltage generating unit to which at least one of a first power source line and a first ground line are connected and which is operable to generate a bias voltage required at the time of a rewrite operation;
a sense amplifier to which at least one of a second power source line and a second ground line are connected and which is operable to sense memory cell data at the time of a read operation, wherein the first voltage generating unit and the sense amplifier are arranged so as to face each other with the memory blocks provided therebetween;
a rewrite memory block to which a bias voltage is applied from the first power generating unit; and
a read memory block to which the sense amplifier is connected.

12. The nonvolatile memory device in accordance with claim 11, wherein a source terminal, a drain terminal, a gate terminal and a back gate terminal of a memory cell inside the rewrite memory block are connected to the first power source line, the first ground line or an output line of the first voltage generating unit, and wherein a source terminal, a drain terminal, a gate terminal and a back gate terminal of a memory cell inside the read memory block are connected to the second power source line, the second ground line or an internal power source line for read purposes generated from these lines.

13. The nonvolatile memory device in accordance with claim 12, wherein the first voltage generating unit and the sense amplifier operate simultaneously.

14. The nonvolatile memory device in accordance with claim 11, wherein the first voltage generating unit and the sense amplifier operate simultaneously.

15. The nonvolatile memory device in accordance with claim 11, further comprising a first switching unit and a second switching unit, each being connected at one end thereof to a bit line connected to a drain terminal of a memory cell inside the memory blocks and arranged so as to face each other with the memory blocks provided therebetween, wherein the first switching unit is connected at the other end thereof to the first power source line, the first ground line or an output line of the first voltage generating unit, and wherein the second switching unit is connected at the other end thereof to the second power source line, the second ground line or an internal power source line for read purposes generated from these lines.

16. The nonvolatile memory device in accordance with claim 11, further comprising a third switching unit and a fourth switching unit, each being connected at one end thereof to a source line or a bit line of a virtual ground-type connected to a source terminal of a memory cell inside the memory blocks, and arranged so as to oppose each other, with the memory blocks provided therebetween, wherein the third switching unit is connected at the other end thereof to the first power source line, the first ground line or an output line of the first voltage generating unit, and wherein the fourth switching unit is connected at the other end thereof to the second power source line, the second ground line or an internal power source line for read purposes generated from these lines.

17. The nonvolatile memory device in accordance with claim 11, further comprising a fifth switching unit and a sixth switching unit, each being connected at one end thereof to a well line connected at a back gate terminal of a memory cell inside the memory blocks, and arranged so as to oppose each other with the memory blocks provided therebetween, wherein the fifth switching unit is connected at the other end thereof to the first power source line, the first ground line or an output line of the first voltage generating unit, and wherein the sixth switching unit is connected at the other end thereof to the second power source line, the second ground line or an internal power source line for read purposes generated from these lines.

18. The nonvolatile memory device in accordance with claim 11, further comprising a seventh switching unit and an eighth switching unit, each being connected at one end thereof to a word line connected to a gate terminal of a memory cell inside the memory blocks, and arranged so as to oppose each other with the memory blocks provided therebetween, wherein the seventh switching unit is connected at the other end thereof to the first power source line, the first ground line or an output line of the first voltage generating unit, and wherein the eighth switching unit is connected at the other end thereof to the second power source line, the second ground line or an internal power source line for read purposes generated from these lines.

* * * * *